INVENTORS
RONALD E. ENSTROM & JOHN R. APPERT
BY Abraham Sherman
ATTORNEY

Dec. 16, 1969 R. E. ENSTROM ET AL 3,484,208

SUPERCONDUCTORS

Filed Aug. 17, 1967 3 Sheets-Sheet 2

INVENTORS
RONALD E. ENSTROM &
JOHN R. APPERT

BY Abraham Sherman
ATTORNEY

Dec. 16, 1969 R. E. ENSTROM ET AL 3,484,208

SUPERCONDUCTORS

Filed Aug. 17, 1967 3 Sheets-Sheet 3

INVENTORS
RONALD E. ENSTROM &
JOHN R. APPERT

BY Abraham Sherman
ATTORNEY

United States Patent Office 3,484,208
Patented Dec. 16, 1969

3,484,208
SUPERCONDUCTORS
Ronald E. Enstrom, Skillman, N.J., and John R. Appert, Levittown, Pa., assignors to RCA Corporation, a corporation of Delaware
Filed Aug. 17, 1967, Ser. No. 661,361
Int. Cl. C22c 13/00, 31/00
U.S. Cl. 29—194 6 Claims

ABSTRACT OF THE DISCLOSURE

A superconductive alloy having a high critical magnetic field is provided consisting of niobium and tin in the molar ratio of about 3:1. The alloy includes at least 10 atoms per million of at least one member of the group consisting of bismuth, vanadium and silicon. The preferred range is 10 to 200 bismuth atoms per million; 100 to 3000 vanadium atoms per million; and 500 to 15,000 silicon atoms per million. The alloy may be deposited from the vapor phase on an elongated flexible substrate such as a high tensile strength metallic ribbon.

BACKGROUND OF THE INVENTION

Field of the invention

This invention relates to improved superconductive materials, and more particularly to improved superconductive niobium tin alloys having a high critical magnetic field.

Description of the prior art

An important parameter of a superconductive material is the strength of the magnetic field at and above which the material ceases to be superconducting. This parameter is known as the critical magnetic field, and depends on the temperature of the superconductor in a manner which is a fixed characteristic of each superconducting material. Superconductive materials which exhibit a high critical magnetic field are preferred for such applications as the fabrication of superconducting electromagnets, since the critical magnetic field of the superconductor utilized represents the highest magnetic field obtainable by the electromagnet. One of the preferred superconductive materials for this purpose is niobium tin, $Nb_3Sn$, also known as niobium stannide, which consists of niobium and tin in the molar ratio of about 3:1 respectively. For a detailed description of the characteristics and applications of niobium tin, see RCA Review, vol. XXV, No. 3, September 1964. Although niobium tin has a very high critical magnetic field, improvement in this respect is desirable for the fabrication of improved superconductive electromagnets.

Accordingly, it is an object of this invention to provide improved superconductive materials.

SUMMARY OF THE INVENTION

A superconductive alloy is provided consisting essentially of niobium and tin in the molar ratio of about 3:1, and including an additive comprising at least 10 atoms per million of at least one member of the group of elements consisting of bismuth, vanadium and silicon. According to one embodiment, the superconductive alloy is deposited on an elongated flexible substrate such as a high tensile strength ribbon.

THE DRAWING

The invention will be described in greater detail in conjunction with the accompanying drawing, in which.

THE PREFERRED EMBODIMENTS

The niobium tin alloys of the invention are superconductive in bulk form. If desired, they may be deposited on insulating or semiconductive substrates, or on metallic plates to form powerful permanent magnets, as described in U.S. Patent 3,281,738, issued to J. J. Hanak on Oct. 25, 1966. For the fabrication of superconductive electromagnets, the superconductive alloys of the invention are preferably deposited as a thin flexible coating on a flexible substrate such as a ribbon or wire. The coated substrate is then readily wound into coils. Suitably, the substrate consists of a high tensile strength metal or alloy or clad metal having a melting point about 1000° C. The substrate may for example consist of pure metals such as niobium or platinum, or clad metals, or stainless steel, or alloys of nickel, iron, cobalt, chromium, tungsten, niobium, tantalum, rhodium, palladium, titanium, zirconium, or the like. Such substrates are hereinafter termed metallic substrates.

A convenient vapor phase method of depositing a niobium tin coating on a flexible metallic substrate is described in U.S. Patent 3,268,362, issued on Aug. 3, 1966, to J. J. Hanak and J. L. Cooper. The method utilizes the reduction by hydrogen of the mixed vapors of niobium chloride and tin chloride while continuously passing an elongated flexible substrate through the mixed gases and vapors.

It has unexpectedly been found that by the addition of at least one volatile compound of an element of the group consisting of bismuth and vanadium and silicon to the mixed vapors, the vapor deposited niobium tin coating incorporates at least one member of the group, and the critical magnetic field of the coating is improved. The amounts of bismuth or vanadium or silicon required as an additive to provide significant improvement in the superconductive alloys thus deposited are generally small, on the order of those amounts utilized for the doping of semiconductors, and may be expressed in terms of atoms per million, so that 10 atoms per million is the equivalent of 0.001 atomic percent, while 15,000 atoms per million is the equivalent of 1.5 atomic percent.

Example I.—In the present example, small amounts of a volatile bismuth compound such as bismuth chloride are added to the mixture of niobium chloride and tin chloride vapors. The bismuth chloride is produced by passing chlorine at the rate of 1.4 ml. per minute over high purity bismuth shot. The vapors of niobium chloride and tin chloride are produced by passing chlorine at the rate of 140 ml. per minute over niobium and tin contained in separate furnace boats, as described in Example IV of the Hanak and Cooper U.S. Patent 3,268,362. The substrate utilized in this example is stainless steel ribbon.

Figure 1:
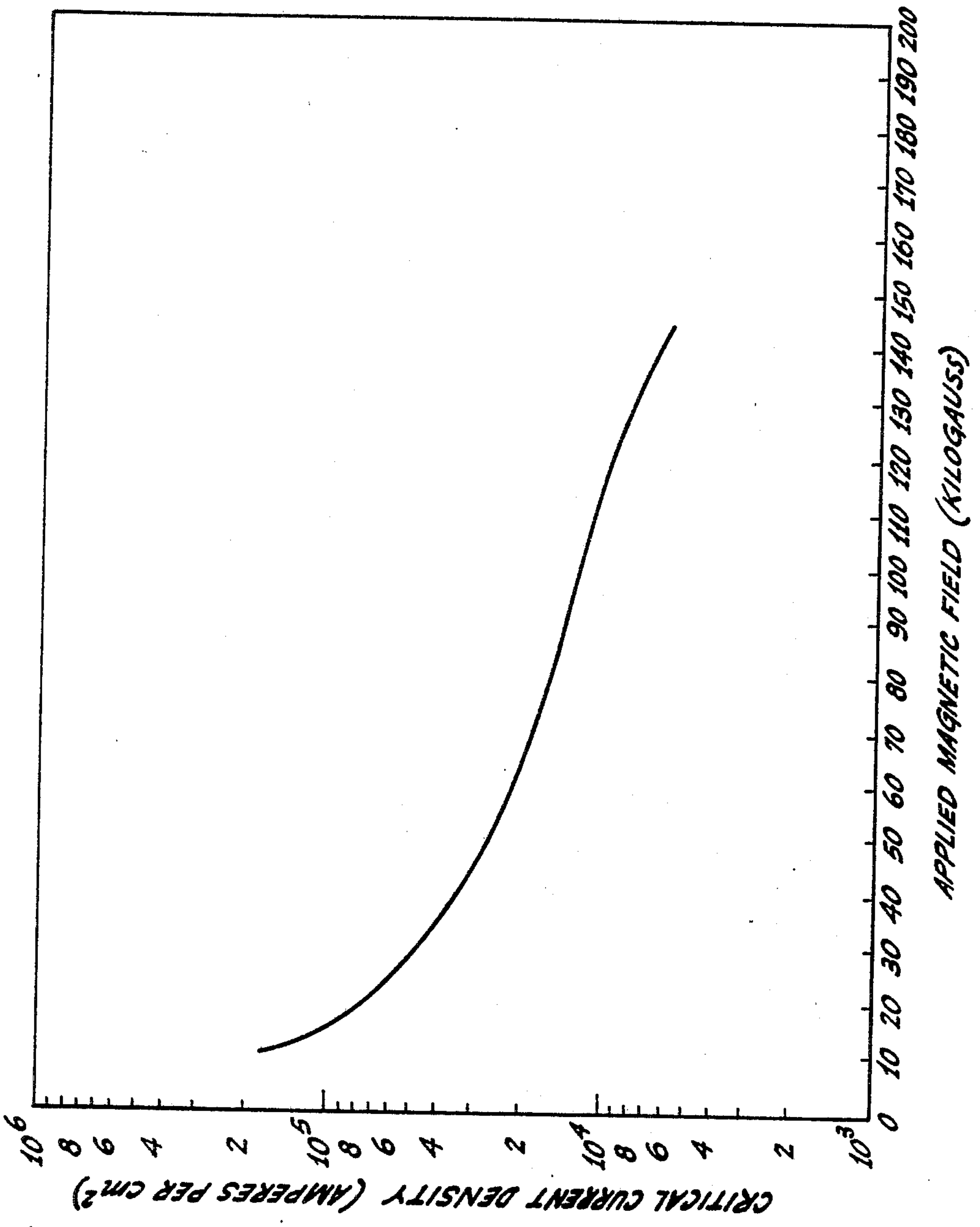
FIGURE 1 is a plot of the variation of the critical current density in amperes per cm.$^2$ with applied magnetic field in kilogauss for niobium tin alloyed with bismuth.

The niobium tin coating thus deposited on the stainless steel substrate incorporates about 10 to 200 bismuth atoms per million. Whereas niobium tin coatings deposited on metallic substrates such as stainless steels have exhibited a critical magnetic field of about 184 kilogauss, the superconductive coating according to this example consisting of niobium tin doped with about 20 bismuth atoms per million exhibits a critical magnetic field of about 219 kilogauss, i.e., an improvement of 19 percent. FIGURE 1 is a plot showing the variation of the critical magnetic field in kilogauss with current density in amperes per cm.$^2$ for alloys of niobium tin and bismuth on a metallic substrate according to this example measured at 4.2° K.

Example II.—In this example, a superconductive coating of niobium tin is deposited on a flexible metallic substrate as described in Example I. However, in this example, a volatile compound of vanadium is utilized. The volatile compound consists of vanadium chloride, and is formed by chlorinating a vanadium rod. The rate of flow of the chlorine over the vanadium rod is 11.2 ml. per minute. The apparatus utilized is similar to that shown in FIGURE 5 of page 349 of the RCA Review, September 1964. The rate of flow of the chlorine over the niobium is 55 ml. per minute, and the rate of flow of the chlorine over the tin is 85 ml. per minute. The superconductive coating thus deposited suitably contains about 100 to 3000 vanadium atoms per million. The critical magnetic field of the material of this example, consisting of a flexible metallic substrate coated with an alloy of niobium tin containing about 1000 atoms per million vanadium, is about 215 kilogauss. This is an improvement of about 17% as compared to comparable previous materials consisting of niobium tin only on a similar metallic substrate.

Figure 2:
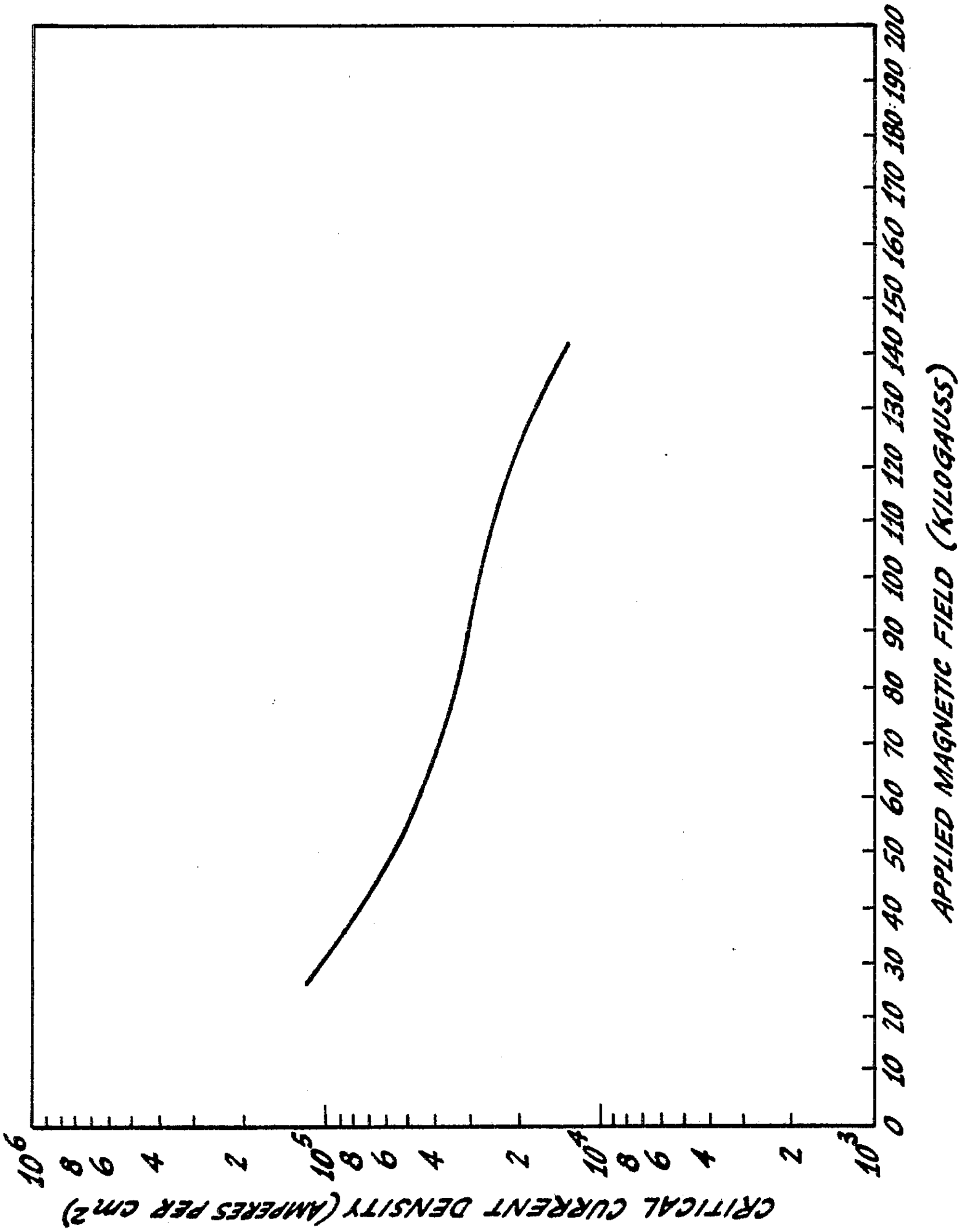
FIGURE 2 is a plot of the variation of critical current density in amperes per cm.$^2$ with applied magnetic field in kilogauss for niobium tin alloyed with vanadium.

FIGURE 2 is a plot of the variation of the critical magnetic field in kilogauss with current density in amperes per cm.$^2$ for alloys according to this example consisting of niobium tin and vanadium deposited on a metallic substrate.

Example III.—In this example, a superconductive coating of niobium tin is deposited on a flexible metallic substrate as described in Example I in the presence of a volatile silicon compound, which in this example consists of silicon tetrachloride. The silicon tetrachloride is produced by passing chlorine at the rate of 35 ml. per minute over electronic grade silicon chips. The apparatus utilized is similar to that of Example II. The rate of flow of the chlorine over the niobium is 55 ml. per minute, and the rate of flow of chlorine over the tin is 85 ml. per minute. The niobium tin coating thus deposited on a stainless steel ribbon incorporates about 14,000 atoms per million silicon, and exhibits a critical magnetic field of 225 kilogauss. This is an improvement of 22% as compared to prior art steel ribbons similarly coated with niobium tin.

Figure 3:
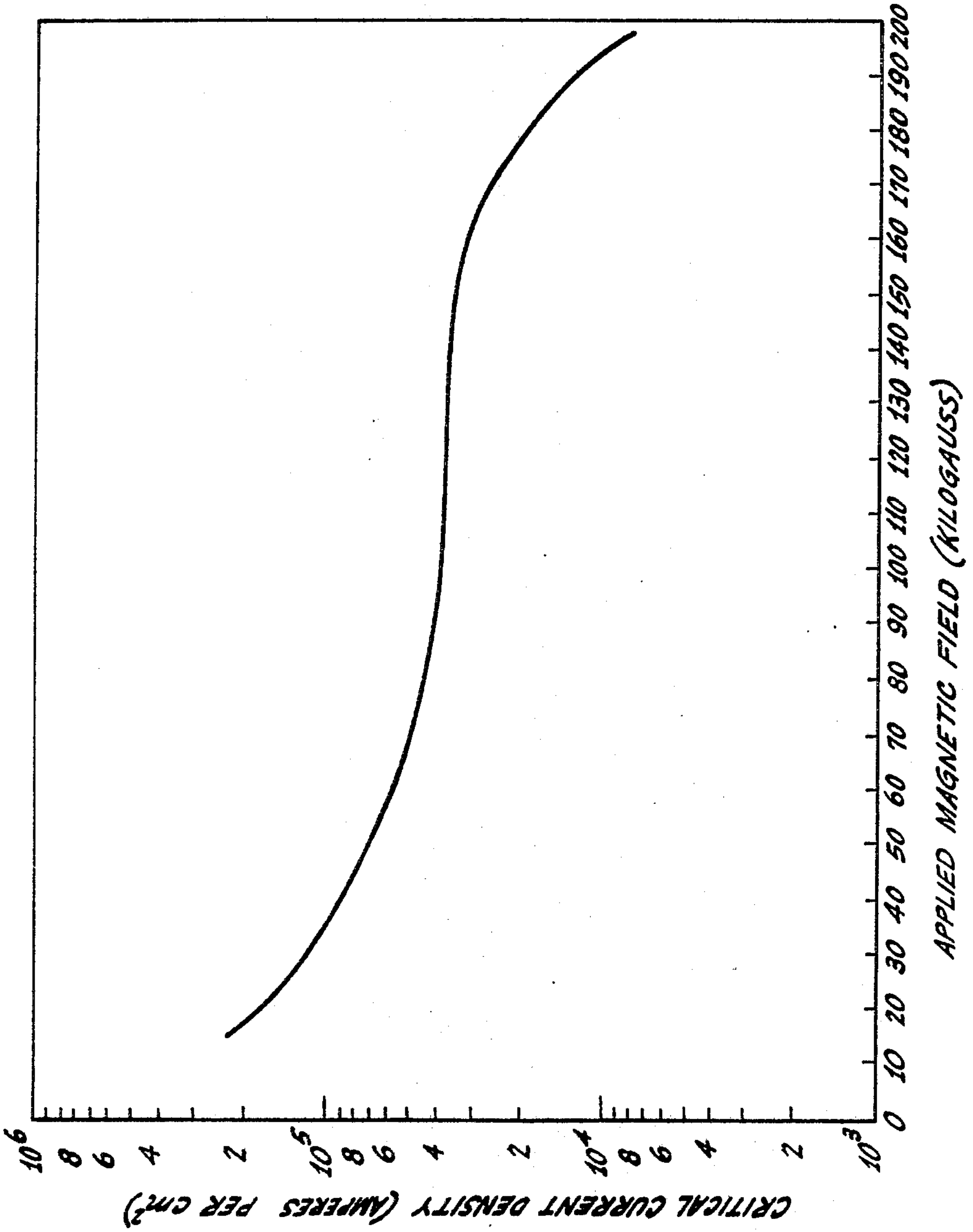
FIGURE 3 is a plot of the variation of critical current density in amperes per cm.$^2$ with applied magnetic field in kilogauss for niobium tin alloyed with silicon.

FIGURE 3 is a plot of the variation of critical magnetic field in kilogauss with current density in amperes per cm.$^2$ for alloys of niobium tin and silicon in accordance with this example measured at 4.2° K.

The above examples are by way of illustration only. A wide variety of metallic or insulating or semiconductive substrates may be utilized. Alloys may be made containing more than one member of the group consisting of bismuth, vanadium, and silicon. Other modifications may be made without departing from the spirit and scope of the invention as set forth in the specification and the appended claims.

We claim:

1. A superconductive alloy consisting essentially of niobium and tin in the molar ratio of about 3:1, said alloy including an additive comprising at least 10 atoms per million of at least one member of the group consisting of bismuth, vanadium and silicon.

2. A superconductive alloy according to claim 1, wherein said additive comprises 10 to 200 atoms per million of bismuth.

3. A superconductive alloy according to claim 1, wherein said additive comprises 100 to 3000 atoms per million of vanadium.

4. A superconductive alloy according to claim 1, wherein said additive comprises 500 to 15,000 atoms per million of silicon.

5. An article of manufacture comprising an elongated flexible substrate coated with a flexible superconductive coating, said coating consisting essentially of niobium and tin in the molar ratio of about 3:1, said coating including at least 10 atoms per million of at least one element selected from the group consisting of bismuth, vanadium and silicon.

6. The article as in claim 5, wherein said flexible substrate is metallic.

References Cited

UNITED STATES PATENTS

| | | | |
|---|---|---|---|
| 3,244,490 | 4/1966 | Saur | 29—194 |
| 3,290,186 | 12/1966 | Rosi et al. | 148—126 |
| 3,395,000 | 7/1968 | Hanak et al. | 29—194 |
| 3,420,707 | 1/1969 | Hanak | 117—227 |

L. DEWAYNE RUTLEDGE, Primary Examiner

E. L. WEISE, Assistant Examiner

U.S. Cl. X.R.

75—174